(12) United States Patent
Lewis

(10) Patent No.: US 9,368,451 B1
(45) Date of Patent: Jun. 14, 2016

(54) MULTICHIP MODULE WITH REROUTABLE INTER-DIE COMMUNICATION

(71) Applicant: Altera Corporation, San Jose, CA (US)

(72) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/516,527

(22) Filed: Oct. 16, 2014

Related U.S. Application Data

(63) Continuation of application No. 13/339,130, filed on Dec. 28, 2011, now Pat. No. 8,895,981.

(51) Int. Cl.
*H01L 23/58* (2006.01)
*H01L 23/538* (2006.01)
*H01L 27/02* (2006.01)

(52) U.S. Cl.
CPC ........ *H01L 23/5382* (2013.01); *H01L 27/0203* (2013.01)

(58) Field of Classification Search
CPC . H01L 23/5382; H01L 27/0203; H01L 22/22; H01L 2224/16225; H01L 2924/15192; H01L 2924/15311
USPC ............................................................ 257/48
See application file for complete search history.

(56) References Cited

U.S. PATENT DOCUMENTS

| 5,469,390 A * | 11/1995 | Sasaki et al. .................. 365/200 |
| 6,991,947 B1 * | 1/2006 | Gheewala ........................ 438/15 |
| 2013/0159587 A1 * | 6/2013 | Nygren et al. ................ 710/306 |

* cited by examiner

*Primary Examiner* — Thanh T Nguyen
(74) *Attorney, Agent, or Firm* — Okamoto & Benedicto LLP

(57) ABSTRACT

A multichip module (MCM) has redundant I/O connections between its dice. That is, the number of inter-die I/O connections used is larger than the number of connections ordinarily used to provide connectivity between the dice. Defective connections are discovered through testing after MCM assembly and avoided, with signals being rerouted through good (e.g., not defective) redundant connections. The testing can be done at assembly time and the results stored in non-volatile memory. Alternatively, the MCM can perform the testing itself dynamically, e.g., at power up, and use the test results to configure the inter-die I/O connections.

18 Claims, 9 Drawing Sheets

//  MULTICHIP MODULE WITH REROUTABLE INTER-DIE COMMUNICATION

BACKGROUND

In integrated circuit fabrication, the size of a die (or diced semiconductor wafer) that can be economically produced is limited by defects. The fabrication process inherently produces a certain average number of defects per unit area, such that dice that are larger in area are less likely to be functional. Consequently the cost per die significantly increases for dice that are larger in area. For dice that contain regular structures such as memories or an array of logic, redundancy within the dice can be used to avoid defective structures. This significantly reduces the cost of large dice. However, such an approach does not work well with irregular structures or structures that are coupled to specific input/output (I/O) connection points.

One approach to this inherent problem makes use of multichip modules (MCMs) to enable fabrication of large and complex systems at a lower cost. Using this approach, a system within a single package is divided into a number of dice on a substrate with relatively fast inter-die I/O connections or lines. Such I/O connections between dice in a single package may be shorter and constructed from finer wires than connections between dice in different packages. This package configuration enables not only more connections, but faster connections, though the connections will still be slower than connections within a single die. During manufacture, the individual die in an MCM can be tested so that only known acceptable (e.g., not defective) dice are bonded onto a single substrate. Further, the yield enhancement is not dependent on any regularity of logic within the MCM; that is to say, there can be any number of arbitrary structures in the MCM.

However, the inter-die I/O connections of an MCM are subject to defects as well. Consequently, the final product yield may not be as high as desired.

SUMMARY

Generally speaking, the example embodiments described below involve redundant I/O connections between dice on a MCM. That is, the number of inter-die I/O connections used is larger than the number of connections ordinarily used to provide connectivity between the dice. Defective inter-die I/O connections are discovered through testing after MCM assembly and avoided, with signals being rerouted through acceptable (e.g., not defective) redundant connections. The testing can be done at assembly time and the results stored in nonvolatile memory in one embodiment. Alternatively, the testing can be done dynamically, e.g., at power up, and the results can be used to configure the inter-die I/O connections.

Other aspects and advantages will become apparent from the following detailed description, taken in conjunction with the accompanying drawings, which illustrate by way of example the principles of the embodiments.

DETAILED DESCRIPTION

In the following description, numerous specific details are set forth in order to provide a thorough understanding of the exemplary embodiments. However, it will be apparent to one skilled in the art that the example embodiments may be practiced without some of these specific details. In other instances, process operations and implementation details have not been described in detail, if already well known.

Figure 1A:
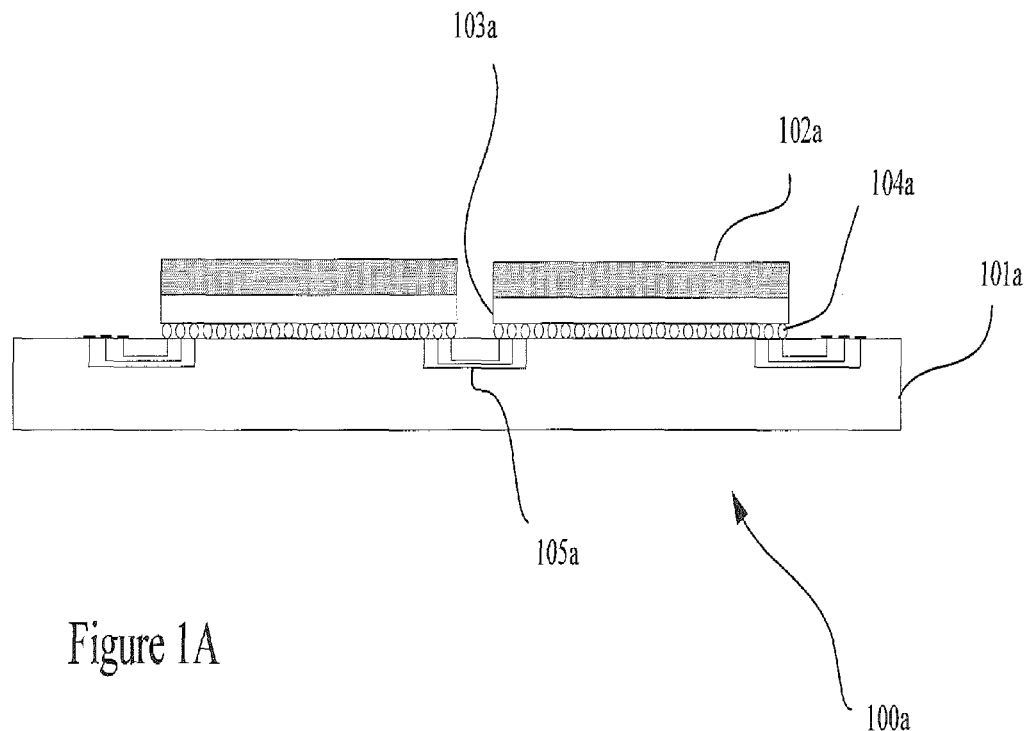
FIGS. 1A and 1B show cross-sections of multichip modules, in accordance with an example embodiment.
Figure 1B:
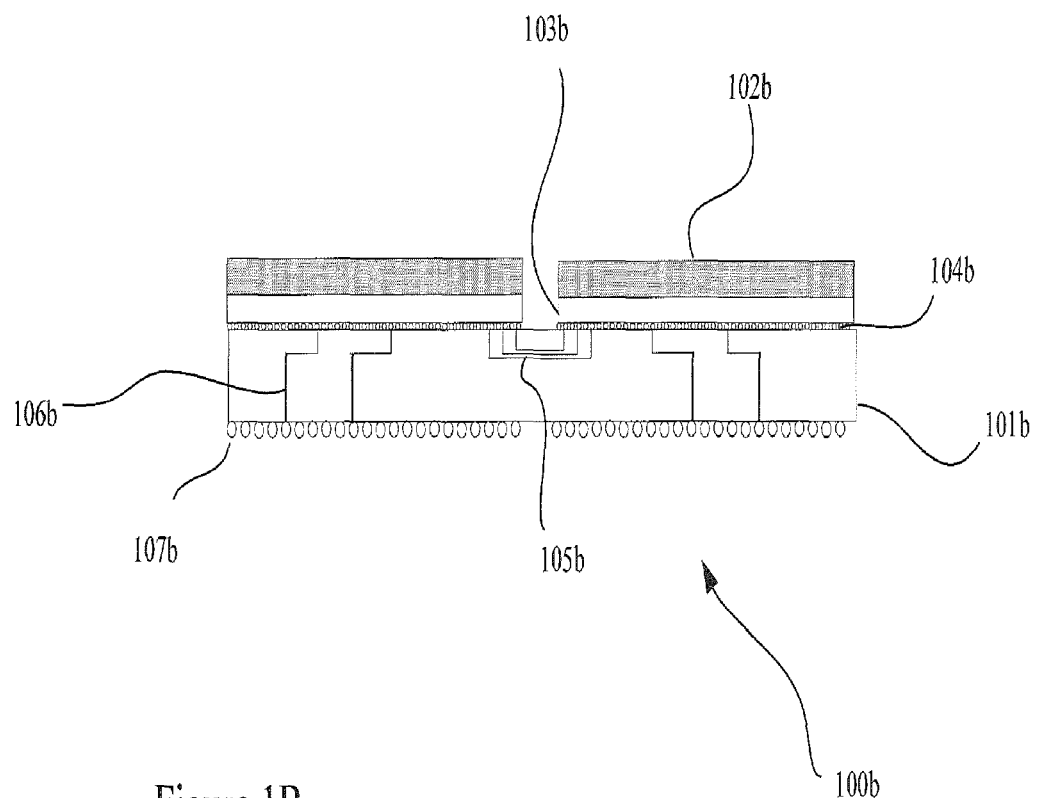

FIGS. 1A and 1B show cross-sections of multichip modules (MCMs), in accordance with an example embodiment. As depicted in FIG. 1A, an MCM 100a includes two die (colored gray), one of which is die 102a. Die 102a is connected to a wiring layer 103a, which in turn is connected by solder bumps 104a (e.g., flip-chip solder bumps) to inter-die I/O connections 105a in a substrate 101a, in an example embodiment. As indicated earlier, the inter-die I/O connections 105a are slower than on-die connections, but faster and more numerous than conventional off-die connections. In an example embodiment, the inter-die connections 105a might be routed as multiple connections per layer.

FIG. 1B shows an alternative example embodiment. As depicted in this figure, an MCM 100b also includes two die (colored gray), one of which is die 102b. Die 102b is connected to a wiring layer 103b, which in turn is connected by solder bumps 104b to inter-die I/O connections 105b in a substrate 101b, in an example embodiment. In this example embodiment, solder bumps 104b are also connected to through-silicon vias 106b that traverse substrate 101b and connect to solder balls 107b.

Figure 2:
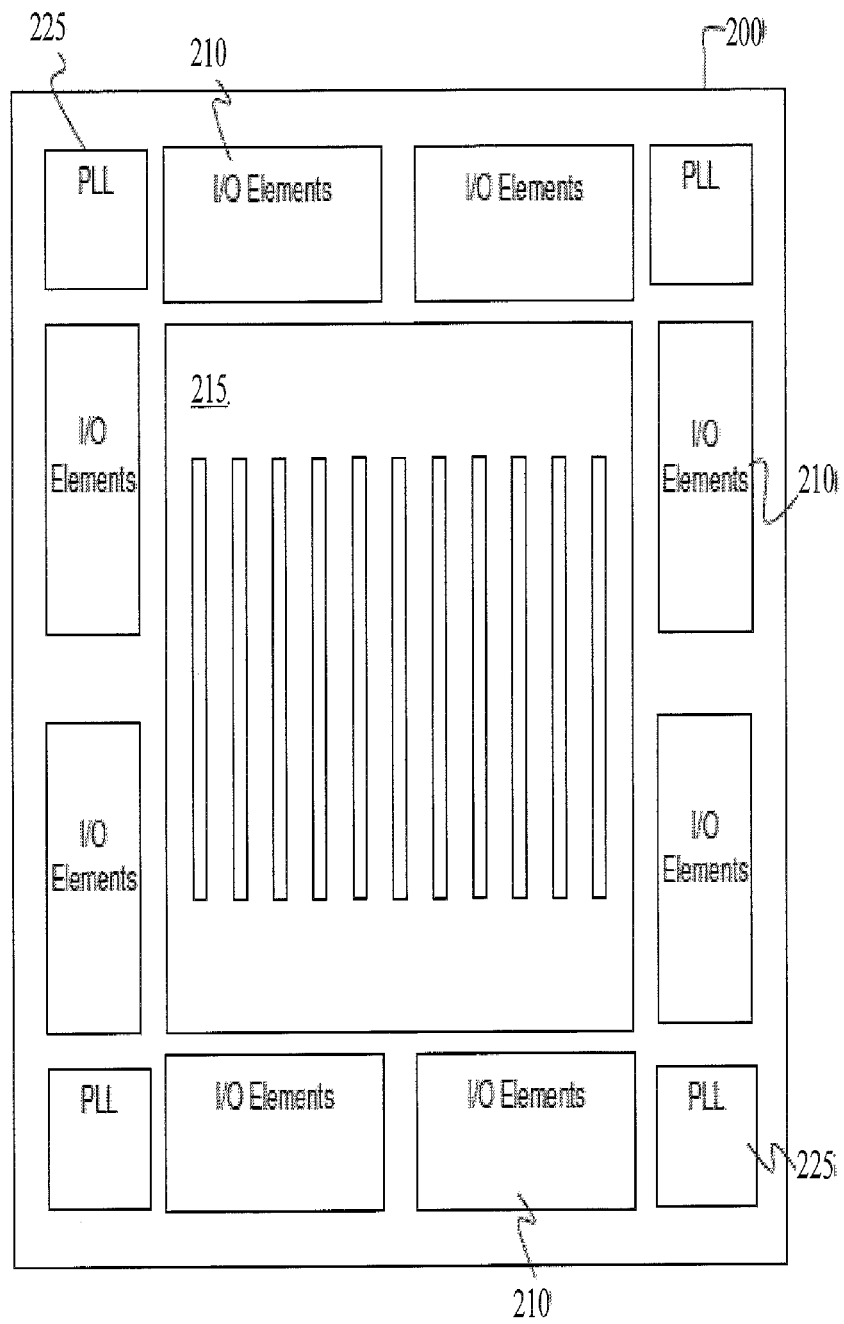
FIG. 2 shows an exemplary die that may be incorporated into a multichip module, in accordance with an example embodiment.

FIG. 2 shows a die for a multichip module, in accordance with an example embodiment. As shown in this figure, the die might be a programmable logic device (PLD) 200 that includes logic region 215 and I/O elements 210, in an example embodiment. I/O elements 210 may support a variety of memory interfaces. Other auxiliary circuits, such as phase-locked loops (PLLs) 225 for clock generation and timing, can be located outside the core logic region 215, e.g., at corners of programmable logic device 200 and adjacent to I/O elements 210. Logic region 215 may be populated with logic cells which include, among other things, at the most basic level, "logic elements" (LEs), or at a more complex level, programmable intellectual property (IP) blocks. It will be appreciated that programmable logic blocks implementing commonly-used functions is frequently referred to as an "IP core." It will also be appreciated that LEs may include lookup table-based logic regions and may be grouped into "Logic Array Blocks" (LABs). The LEs or LABs can be configured to perform logical functions desired by the user.

Figure 3A:
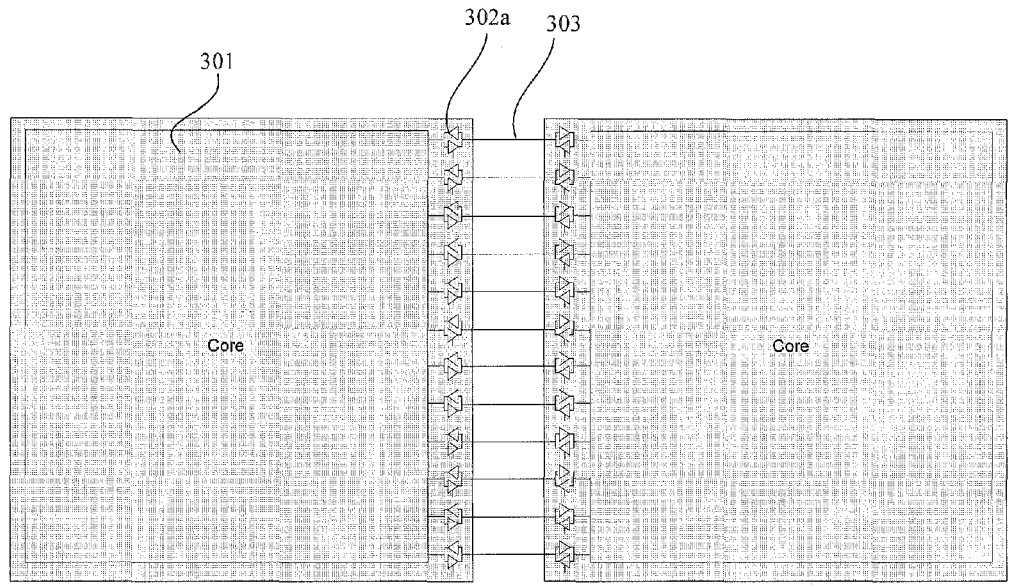
FIGS. 3A and 3B show exemplary I/O connections between the two cores of a multichip module, in accordance with an example embodiment.
Figure 3B:
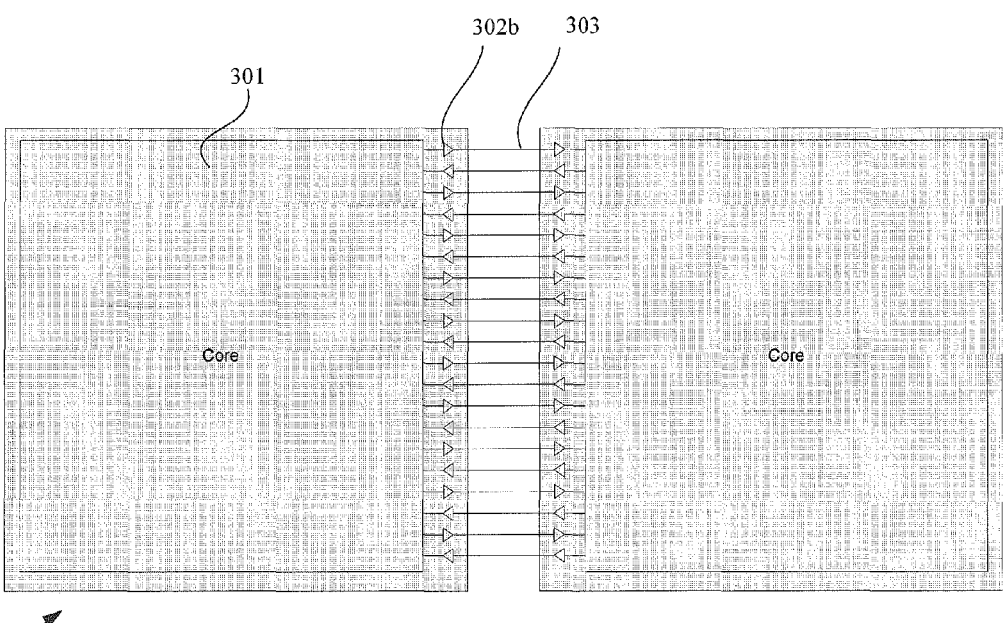

FIGS. 3A and 3B show the I/O connections between the two cores of a multichip module, in accordance with an example embodiment. As depicted in FIG. 3A, an MCM 300 includes two dice, one of which is a die with a core 301 (e.g., an IP core, which may be logic elements that are programmed based on some configuration bit streams) consisting of logic circuits connected to tri-state buffers 302a, which in turn are connected to inter-die I/O connections 303 that connect the two dies. In FIG. 3A, the inter-die I/O connections 303 are bi-directional, that is to say, the signals for their tri-state buffers (e.g., tri-state buffers 302a) have not yet been selected so as to establish a single direction. By contrast, in FIG. 3B, the inter-die connections 303 are unidirectional, and use conventional logic buffers to communicate between the die. Consequently each wire can transmit a signal in only one direction. A MCM might also contain more than two die.

In the description that follows, "normal connections" are the inter-die I/O connections that are ordinarily visible to the logic on the dice (e.g., connections that are usable to connect logic between the two die). As discussed below in greater detail, an example embodiment makes use of extra inter-die I/O connections (e.g., over and above the normal connections) on the MCM and corresponding buffers on the dice, as well as switching (or rerouting) circuits to use the extra inter-die I/O connections in the case that one or more of the normal connections is defective. These extra inter-die I/O connections are referred to as "redundant connections."

Figure 4A:
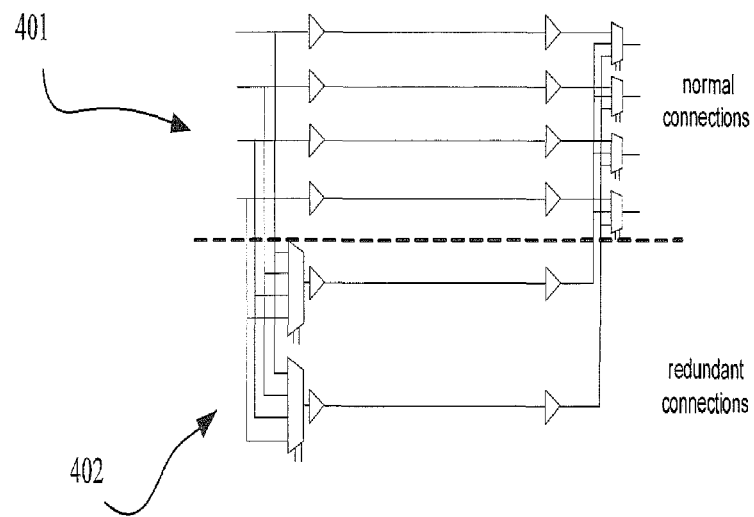
FIGS. 4A and 4B show the use of redundant I/O connections, in accordance with an example embodiment.
Figure 4B:
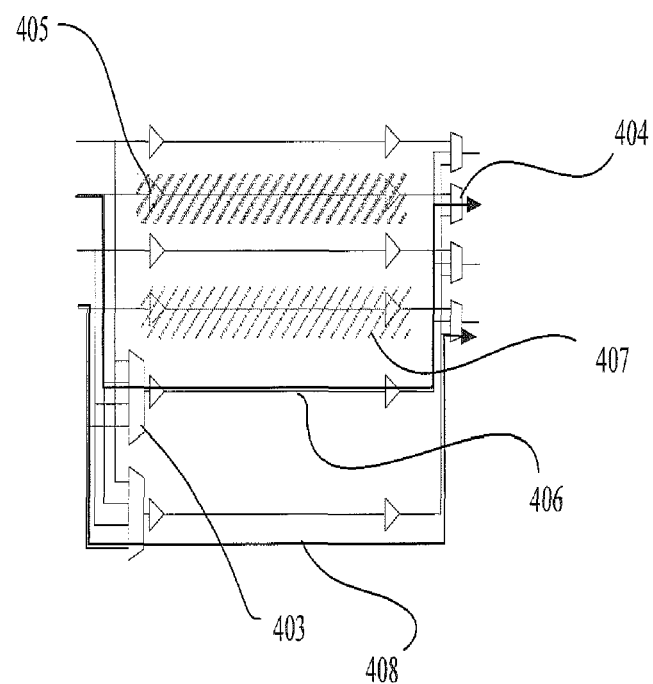

FIGS. 4A and 4B show the use of redundant I/O connections, in accordance with an example embodiment. As depicted in FIG. 4A, an example embodiment includes four normal connections 401 and two redundant connections 402. Each of the four normal connections connects to a receiver (e.g., a mux), which can select either from a signal associated with a normal connection or a signal from either of the two redundant connections 402. Likewise, each of the redundant connections connects from a driver (e.g., a mux) that can select a signal associated with one of the four normal connections. Thus, if a normal connection is defective, one of the redundant connections (e.g., one that is itself not defective) can be used to transmit the signal from a redundant connection's driver to a defective connection's receiver.

Such a rerouting is depicted in FIG. 4B. In that figure, normal connection 405 is defective, as shown by the cross-hatching. However, driver 403 for redundant connection 406, (which is good) selects the signal associated with normal connection 405 and drives it to receiver 404. A similar rerouting over good redundant connection 408 is shown for the signal associated with normal connection 407, which is also depicted as being defective.

It can be appreciated that FIGS. 4A and 4B show a "full crossbar" between the normal connections and redundant connections. It is also well known in the art that an arbitrary set of signals can be routed on a "perfect crossbar" which requires slightly fewer multiplexer inputs, and could also be used in the present application.

It will be appreciated that the fabrication of inter-die I/O connections is difficult and subject to yield loss due to defects. An extreme example helps to illustrate this point. Assume that there are 10,000 connections between each die and that each connection has a 0.1% defect rate (or 99.9% probability of being good). It is expected that on average 0.001*10000=10 normal connections will be defective. However there is actually a range of possibilities, so that some MCMs may have fewer than 10 defective connections and some MCMs may have more than 10. The probability of all connections being good is 0.0000452 or approximately 0.005%; in other words, 99.995% of all MCMs will not work as planned. Clearly, the production of non-defective MCMs is not economically feasible.

However, if one assumes that any redundant connection can replace any of the 10,000 normal connections, 25 redundant connections should allow a yield of 99.998%; that is to say, less than 0.002% of MCMs will have more than 25 defective connections. In practice, it might be relatively expensive to provide this amount of flexibility in the switching (or rerouting) logic for an MCM, since each redundant connection would need to select from any one of the 10,000 normal connections. Moreover, such an MCM (referred to as the "ungrouped example embodiment" below) might incur a relatively large delay due to rerouting signals across a large physical span.

To reduce the cost of switching logic and the size of associated delay, an example embodiment might use more redundant connections but restrict their use to a subset of normal connections. In such an example embodiment (referred to as the "grouped example embodiment" below), 10,000 connections might be divided into 250 groups of 40 normal connections. For each group of 40 normal connections, 4 redundant connections might be implemented in such a way that each of the 4 redundant connections might replace any of the 40 connections in that group. In such an example embodiment, the probability of having more than 4 defective connections in 44 total connections is approximately $1 \times 10^{-9}$ and the probability that one or more of the 250 groups will have more than 4 defective connections is approximately $3 \times 10^{-7}$. Thus the total yield is 99.99997%. Although the total number of redundant connections is now 4 per group across 250 groups for a total of 1000, the complexity of the switching (or rerouting) circuitry is significantly reduced, reducing both cost and delay. In another example embodiment focusing on cost, a cost analysis considering the relative cost of a redundant connection and the cost of the switching logic might be performed to find a low cost solution in terms of the number of redundant connections and the size of the groups to achieve a relatively minimal overall cost per good product.

Also, in the grouped example embodiment, each of the redundant connections might use a 40:1 multiplexer (mux) to select at the driver a signal associated with a normal connection and a 5:1 mux to select at the receiver a signal associated with a normal connection or a signal from one of the redundant connections. These muxes would ordinarily use 6 ($2^6$>40) bits and 3 ($2^3$>5) bits respectively for their control inputs. It will be appreciated that the actual values (e.g., 0 or 1) for control bits for the switching circuits is dependent on the set of defective connections in a specific MCM.

It will also be appreciated that the non-grouped example embodiment might use 25 redundant connections that could each select from 10,000 signals associated with normal connections, for a total of 250,000 fan-ins. By contrast, the grouped example embodiment might use 250*4=1000 redundant connections but each connection selects only from 40 signals associated with normal connections for a total of 40,000 fan-ins.

Furthermore the smaller range of selection means that the grouped example embodiment will be relatively faster, since the 10,000 signals are likely to be spread across the edge of the die and it takes considerable time to transmit a signal the length of one side of a die.

Since there are 250 groups each containing 4 drivers with 6 bits (b) for control and 10,000 receivers with 3 b for control, a total of 250*4*6+10,000*3=36,000 b might be used to configure all of the muxes in the grouped example embodiment.

In one example embodiment, the control bits for the switching (or rerouting) logic might be stored in programmable read-only memory (PROM), electrically erasable programmable read-only memory (EEPROM), Flash memory, or other non-volatile memory (NVM). In an alternative example embodiment, the data might be stored in volatile memory, which might be configured as part of (a) device initialization or (b) programming or configuration, e.g., in the case of a field-programmable gate array (FPGA). Such data will be specific to the particular defects in a specific MCM. The amount of memory required might be reduced at the cost of more complex decoding of the control.

Further, in the group example embodiment, it might be specified that only a maximum of 25 defects across all 10,000 total connections are to be rerouted, since this amount of rerouting gives a relatively good yield of 99.998%. In this instance, the location of each defective connection can be encoded using 14 b ($2^{14}$>10,000). A total of 350 b (25 encodings each of which 14 b) might be stored on an MCM in Flash (or other nonvolatile) memory. Thereafter, e.g., at power up, control logic might read the 350 b of defect information and generate the 36,000 b (30,000 b for the receivers and 6,000 b for the drivers) for controlling the muxes involved in rerouting. In an example embodiment, these 36,000 b might be stored in RAM (or other volatile) memory associated with the muxes.

Figure 5:
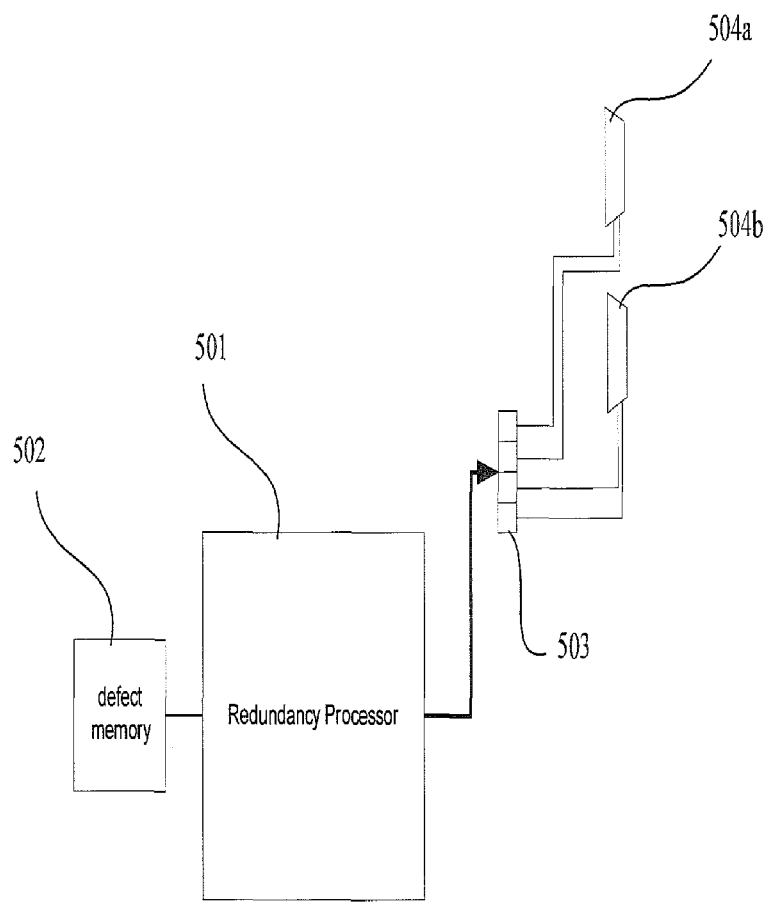
FIG. 5 shows a redundancy processor and defect memory, in accordance with an example embodiment.

FIG. 5 shows a redundancy processor 501 (e.g., control logic) which reads data (e.g., control bits) from defect memory 502 and then generates the control signals for driving mux 503 and receiving muxes 504a and 504b in order to reroute around defective connections. As indicated above, defect memory 502 storing the defect information might be NVM, if the MCM is tested for defective inter-die connections at fabrication time. It will be appreciated that this NVM might be located on the MCM or it might be off-chip, e.g., on a computer's hard drive, in alternative example embodiments. In an example embodiment, the defect information might include defect locations and/or redundancy control information used to configure the muxes that perform the rerouting between defective normal connections and good (e.g., not defective) redundant connections. Alternatively, defect memory 502 might be volatile memory in which defect information is stored after the dice on the MCM performs self-test operations by sequentially testing each of the inter-die connections. Here again, this volatile memory might be located on the MCM or it might be off-chip, e.g., on a computer's hard drive, in alternative example embodiments. In an example embodiment, this testing might be performed upon power-on of the MCM.

Figure 6:
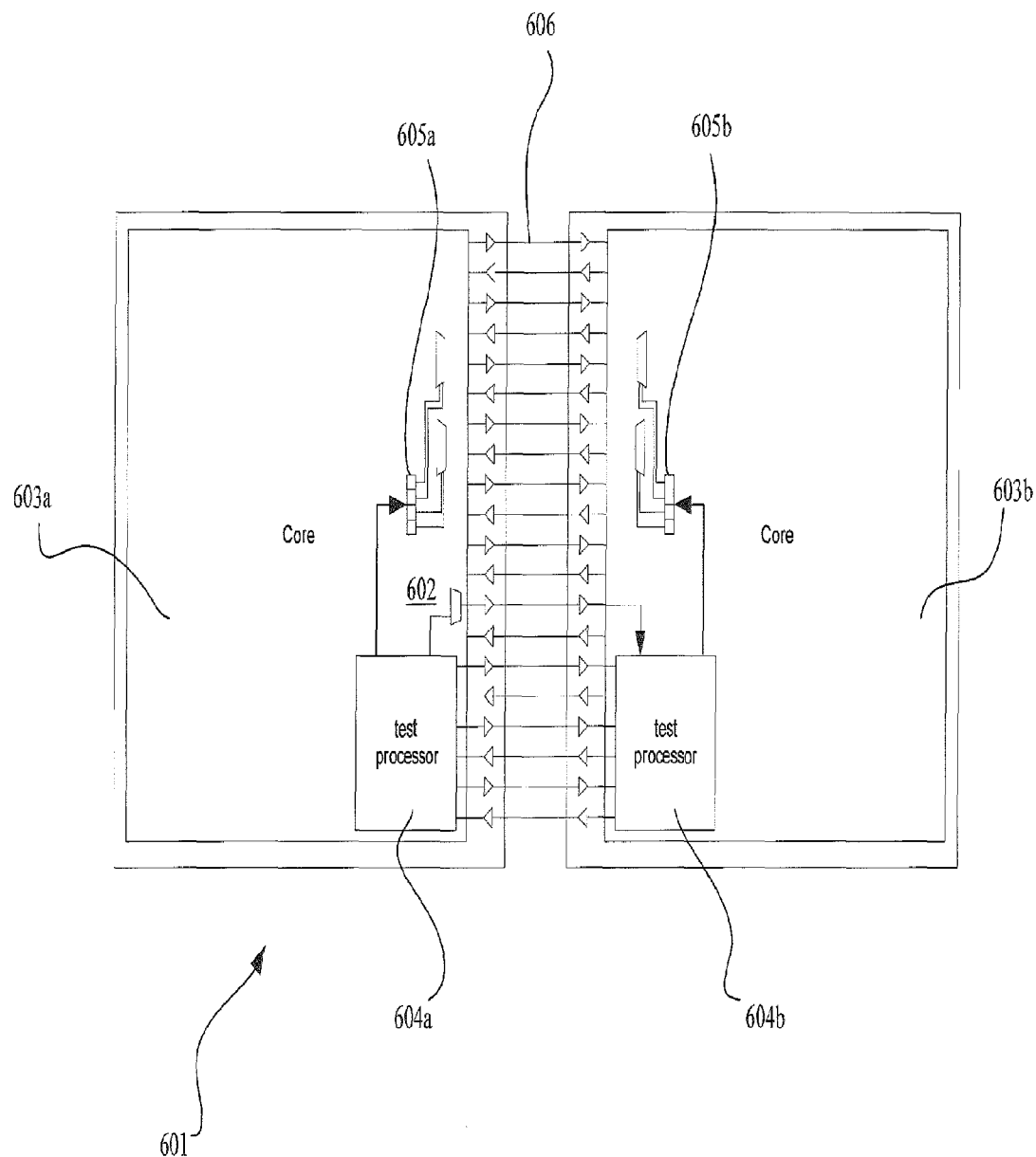
FIG. 6 shows a pair of test processors, in accordance with an example embodiment.

FIG. 6 shows a pair of test processors, in accordance with an example embodiment. As depicted in this figure, an MCM 601 includes two cores, 603a and 603b, each of which has a test processor, 604a and 604b, respectively. The two test processors communicate through connections, which might be connections dedicated to testing such as connection 602 or connections usable for both test and normal communication between the cores, such as connection 606. Each test processor contains a signal path to inject a test signal onto connections and to receive test signals from the connections. In an example embodiment, the connections might use multiplexers to select between test signals and normal signals. As shown in this figure, test processor 604a uses signal path 605a and test processor 604b uses signal path 605b. In an example embodiment, the test processors might test the connections over a period of time to generate the control information (e.g., control bits) to configure the redundancy switching circuits (e.g., driving muxes and receiving muxes).

Figure 7:
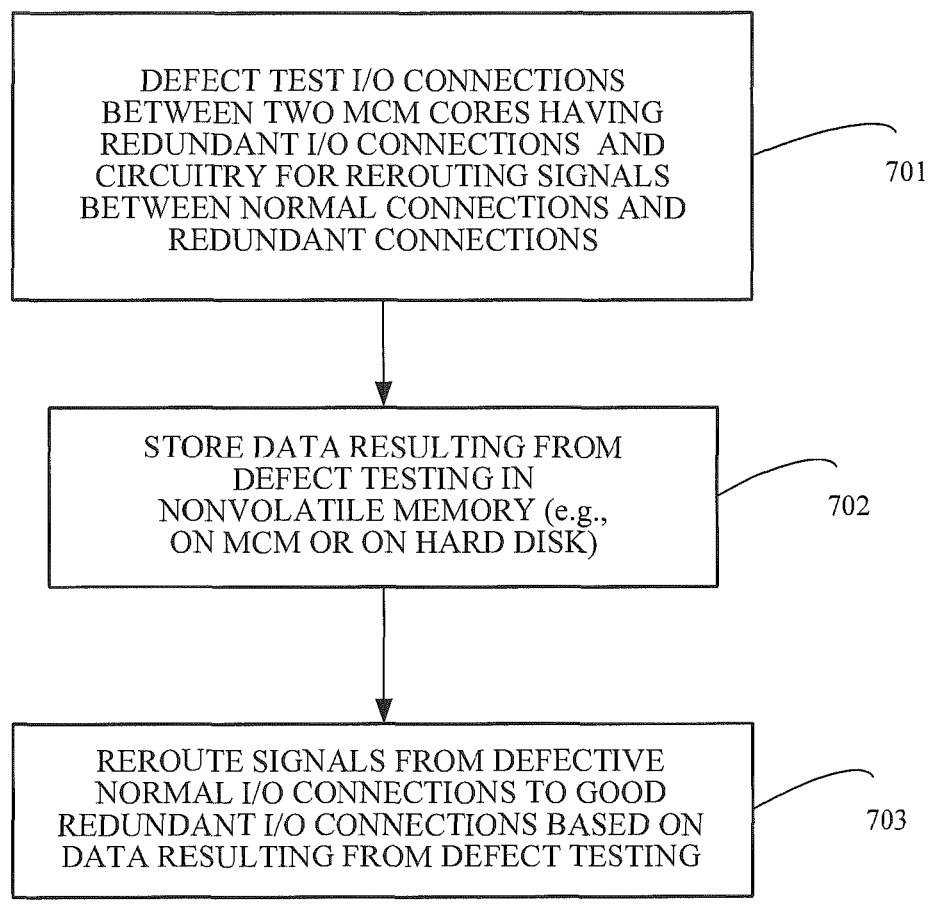
FIG. 7 shows a method for using results from defect testing stored in non-volatile memory, in accordance with an example embodiment.

FIG. 7 shows a method for using results from defect testing stored in non-volatile memory, in accordance with an example embodiment. The method is written from the point of view of control logic, which might be dedicated (e.g., a circuit) or soft (e.g., configurable or programmable). In the first operation of the method, at step 701, the control logic defect tests the I/O connections between two MCM cores (e.g., FPGAs) having redundant I/O connections and circuitry for rerouting signals between normal I/O connections and redundant I/O connections. Then, at step 702, the control logic stores the data resulting from the defect testing in nonvolatile memory (e.g., on an MCM or on a hard disk). As described above, this defect data might include defect locations and/or redundancy control information used to configure the muxes that perform the rerouting between defective normal connections and good redundant connections. At step 703, the control logic reroutes signals from defective normal I/O connections to good redundant I/O connections, based on data resulting from defect testing.

Figure 8:
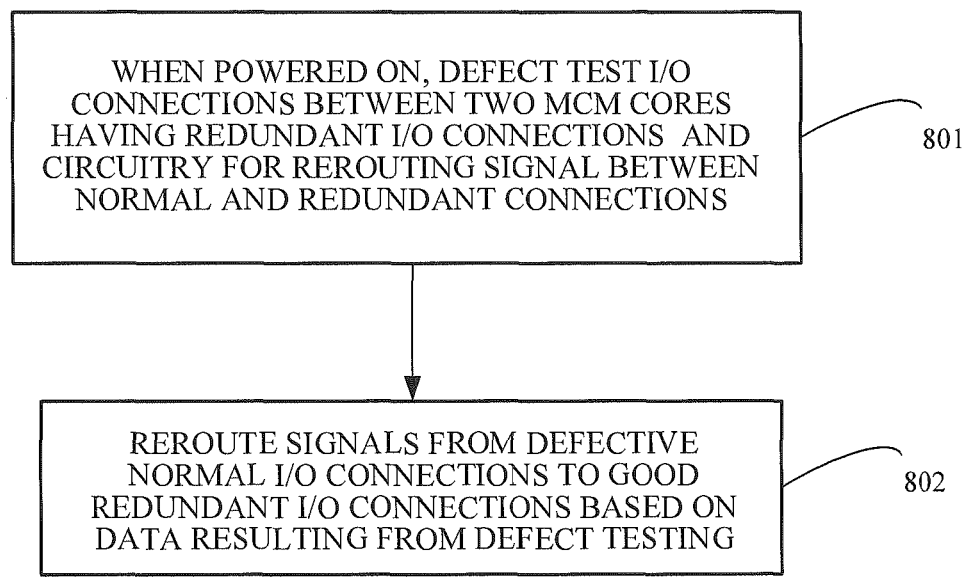
FIG. 8 shows a method for defect testing I/O connections after powering on, in accordance with an example embodiment.

FIG. 8 shows a method for defect testing I/O connections after powering on, in accordance with an example embodiment. Again, the method is written from the point of view of control logic. At step 801, when powered on, the control logic defect tests the I/O connections between two MCM cores (e.g., FPGAs) having redundant I/O connections and circuitry for rerouting signals between normal I/O connections and redundant I/O connections. Then, at step 802, the control logic reroutes signals from defective normal I/O connections to good redundant I/O connections, based on data resulting from defect testing. In an example embodiment, this method might not store the data resulting from defect testing in NVM, e.g., the method might make use of volatile memory. In an alternative example embodiment, the method might store the data resulting from defect testing in NVM, e.g., before or after the second operation.

Figure 9:
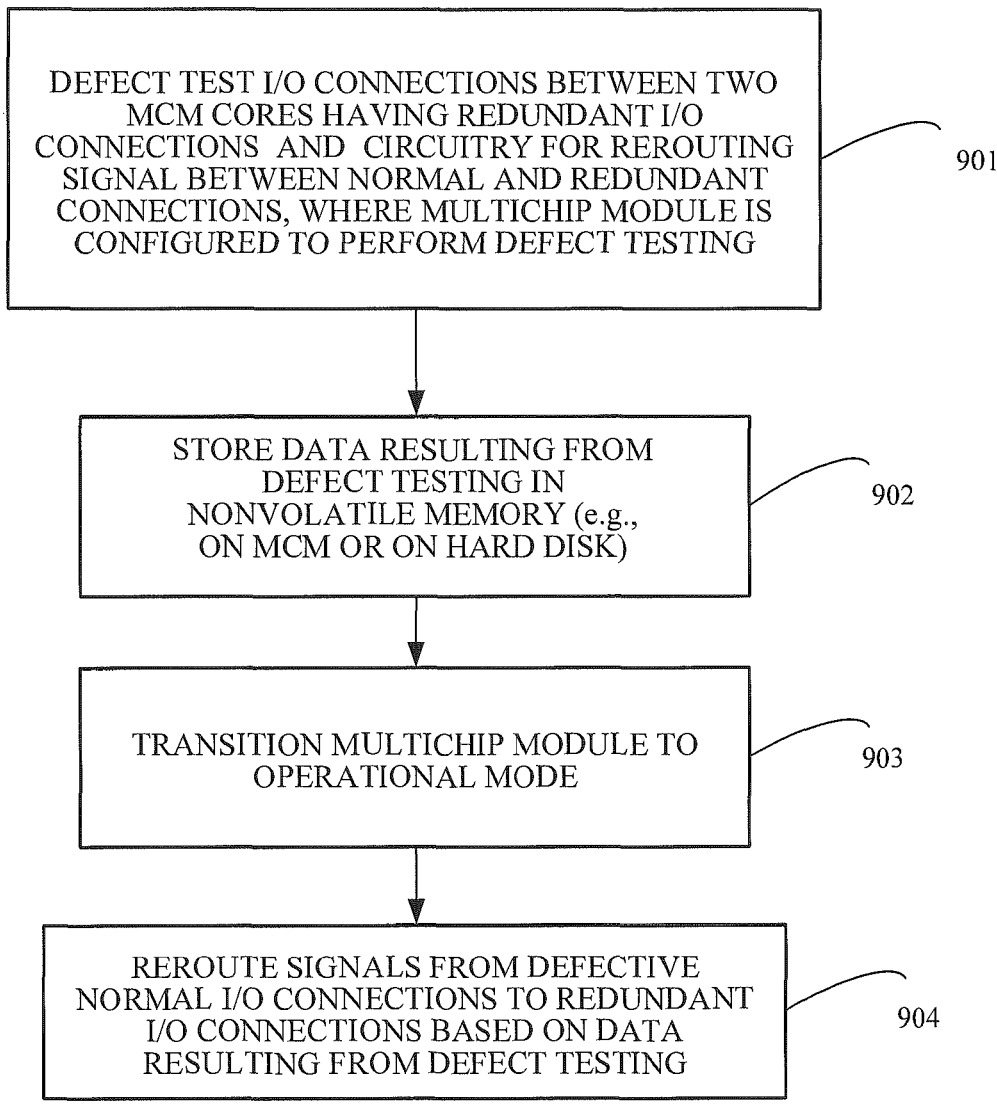
FIG. 9 shows a method for self-testing by an MCM, in accordance with an example embodiment.

FIG. 9 shows a method for self-testing by an MCM, in accordance with an example embodiment. The method is written from the point of view of an MCM that is configured or programmed to perform defect testing. In the first operation of the method, at step 901, the MCM defect tests normal I/O connections between two MCM cores (e.g., FPGAs) having redundant I/O connections and circuitry for rerouting signals between normal I/O connections and redundant I/O connections. This operation might occur every time the MCM is powered on or periodically, e.g., after the MCM has been powered on a particular number of times or after the passage of a particular period of time. Then at step 902, the MCM stores the data resulting from the defect testing in nonvolatile memory (e.g., on the MCM or on a hard disk). In the third operation of the method, at step 903, the MCM transitions to operational mode. And in the fourth operation of the method, at step 904, the MCM reroutes signals from defective normal I/O connections to good redundant I/O connections based on data resulting from defect testing. It will be appreciated that the fourth operation might be performed before the third operation in an example embodiment. In another example embodiment, the fourth operation might be performed after the third operation.

The apparatuses and methods described herein may be incorporated into any suitable circuit. For example, the method and apparatus may be incorporated into numerous types of devices such as programmable logic devices or microprocessors. Example programmable logic devices include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), just to name a few.

Further, such a programmable logic device may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way. Moreover, the method operations described above can be modularized and/or distributed in any suitable way.

Although the foregoing inventions have been described in some detail for purposes of clarity of understanding, it will be apparent that certain changes and modifications can be practiced within the scope of the appended claims. Accordingly, the example embodiments are to be considered as illustrative and not restrictive, and the invention is not to be limited to the details given herein, but may be modified within the scope and equivalents of the appended claims.

What is claimed is:

1. A module, comprising:
    a substrate;
    at least two cores coupled to the substrate wherein each of the at least two cores comprises a test processor that communicates via test signals with the test processor in the other of the at least two cores wherein the test signals are communicable via at least one connection that is dedicated to testing;
    a plurality of Input/output (I/O) connections between said at least two cores, wherein the plurality of I/O connections includes at least one redundant I/O connection; and
    circuitry configured to reroute a signal from an I/O connection of the plurality of I/O connections to the at least one redundant I/O connection based on a determination that said I/O connection is defective.

2. A module as in claim 1, wherein the determination is performed during fabrication of the module.

3. A module as in claim 2 further comprising a nonvolatile memory for storing data resulting from the determination.

4. A module as in claim 3, wherein data resulting from the determination is stored in external nonvolatile memory.

5. A module as in claim 1, wherein the determination is performed when powering on the module.

6. A module as in claim 1 further comprising logic for controlling the circuitry.

7. A module as in claim 6, wherein the logic is dedicated logic.

8. A module as in claim 6, wherein the logic is soft logic.

9. A module as in claim 1 further comprising soft logic for conducting the determining.

10. A multi-chip module (MCM), comprising:
    a substrate;
    at least two cores coupled to the substrate wherein each of the at least two cores comprises a test processor that communicates via test signals with the test processor in the other of the at least two cores wherein the test signals are communicable via at least one connection that is dedicated to testing;
    a plurality of Input/output (I/O) connections between said at least two cores, wherein the plurality of I/O connections includes at least one redundant I/O connection, and wherein one of the at least two cores comprises:
        a nonvolatile memory storing data identifying a defective I/O connection of the plurality of I/O connections; and
    circuitry configured to reroute a signal from an I/O connection of the plurality of I/O connections to the at least one redundant I/O connection based on the data identifying a defective I/O connection.

11. A MCM as in claim 10, wherein the data identifying the defective I/O connection is obtained during fabrication of the MCM.

12. A MCM as in claim 11 further comprising a nonvolatile memory for storing the data identifying the defective I/O connection.

13. A MCM as in claim 12, wherein data identifying the defective I/O connection is stored in external nonvolatile memory.

14. A MCM as in claim 10, wherein determination of storage of data identifying the defective I/O connection is performed when powering on the module.

15. A MCM as in claim 10, further comprising logic for controlling the circuitry.

16. A MCM as in claim 15, wherein the logic is dedicated logic.

17. A MCM as in claim 15, wherein the logic is soft logic.

18. A MCM as in claim 10, further comprising soft logic for conducting identification of the defective I/O connection.

* * * * *